(12) United States Patent
Yu

(10) Patent No.: US 12,072,639 B2
(45) Date of Patent: Aug. 27, 2024

(54) VIBRATION ATTENUATION STRUCTURE AND EXPOSURE DEVICE

(71) Applicant: CHANGXIN MEMORY TECHNOLOGIES, INC., Anhui (CN)

(72) Inventor: Xianyong Yu, Anhui (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 0 days.

(21) Appl. No.: 17/607,877

(22) PCT Filed: Jun. 24, 2021

(86) PCT No.: PCT/CN2021/101942
§ 371 (c)(1),
(2) Date: Oct. 30, 2021

(87) PCT Pub. No.: WO2022/183635
PCT Pub. Date: Sep. 9, 2022

(65) Prior Publication Data
US 2024/0027924 A1      Jan. 25, 2024

(30) Foreign Application Priority Data

Mar. 4, 2021   (CN) .......................... 202110240551.5

(51) Int. Cl.
*G03F 7/00*   (2006.01)
(52) U.S. Cl.
CPC .......... *G03F 7/709* (2013.01); *G03F 7/70891* (2013.01)

(58) Field of Classification Search
CPC .............. G03F 7/70875; G03F 7/70891; G03F 7/709; G03F 7/7085; G10K 11/161
See application file for complete search history.

(56) References Cited

U.S. PATENT DOCUMENTS 4,527,282 A * 7/1985 Chaplin ........... G10K 11/17881
381/71.13
4,849,668 A * 7/1989 Crawley ................ H10N 30/00
310/317
(Continued)

FOREIGN PATENT DOCUMENTS

CN          101334081 A          12/2008
CN          101818777 A          9/2010
(Continued)

OTHER PUBLICATIONS

Machine translation of JP-09258741-A (Year: 1997).*
(Continued)

*Primary Examiner* — Steven Whitesell Gordon
(74) *Attorney, Agent, or Firm* — Syncoda LLC; Feng Ma

(57) ABSTRACT

A vibration attenuation structure includes: a detection component covering an outer surface of a pipe and configured to detect a vibration frequency of the pipe, and an attenuation component covering the outer surface of the pipe; wherein, the pipe being configured to transmit fluid, the detection component and the attenuation component are arranged in parallel along a direction parallel to an axis of the pipe, and the attenuation component is capable of adjusting a vibration-absorbing frequency of the attenuation component according to the vibration frequency to attenuate vibration of the pipe.

13 Claims, 4 Drawing Sheets

(56) References Cited

U.S. PATENT DOCUMENTS

| | | | |
|---|---|---|---|
| 4,947,434 A * | 8/1990 | Ito | G10K 11/17857 |
| | | | 381/71.7 |
| 5,778,081 A * | 7/1998 | Patrick | G10K 11/161 |
| | | | 381/71.7 |
| 5,979,593 A * | 11/1999 | Rice | F01D 5/16 |
| | | | 381/71.7 |
| 6,002,987 A * | 12/1999 | Kamiya | G03F 7/709 |
| | | | 702/56 |
| 6,178,246 B1 * | 1/2001 | Bebesel | G10K 11/17857 |
| | | | 381/71.11 |
| 6,186,485 B1 | 2/2001 | Kawazoe | |
| 6,897,599 B2 * | 5/2005 | Sorg | G03F 7/70991 |
| | | | 310/326 |
| 6,958,567 B2 | 10/2005 | Fuller et al. | |
| 2001/0009207 A1 * | 7/2001 | Faulhaber | F16L 55/033 |
| | | | 181/224 |
| 2002/0126852 A1 * | 9/2002 | Kashani | G10K 11/17879 |
| | | | 381/94.1 |
| 2003/0152239 A1 * | 8/2003 | Graefenstein | G10K 11/17857 |
| | | | 381/71.7 |
| 2004/0079518 A1 | 4/2004 | del Puerto et al. | |
| 2005/0201567 A1 * | 9/2005 | Browne | G10K 11/17873 |
| | | | 381/71.5 |
| 2008/0098818 A1 * | 5/2008 | Fernald | G01F 1/7082 |
| | | | 73/622 |
| 2009/0195763 A1 * | 8/2009 | Butler | G03B 27/42 |
| | | | 355/53 |
| 2013/0323649 A1 | 12/2013 | Watson et al. | |
| 2019/0287510 A1 * | 9/2019 | Goto | G10K 11/161 |
| 2020/0206777 A1 * | 7/2020 | Suzuki | G10K 11/17875 |

FOREIGN PATENT DOCUMENTS

| | | |
|---|---|---|
| CN | 101818777 B | 8/2011 |
| CN | 102226783 A | 10/2011 |
| CN | 104808448 A | 7/2015 |
| CN | 105257943 A | 1/2016 |
| CN | 105972370 A | 9/2016 |
| CN | 107228167 A | 10/2017 |
| CN | 108223383 A | 6/2018 |
| CN | 110439964 A | 11/2019 |
| CN | 110440087 A | 11/2019 |
| CN | 110486562 A | 11/2019 |
| CN | 111522372 A | 8/2020 |
| CN | 112987508 A | 6/2021 |
| DE | 102018132436 A1 | 10/2019 |
| JP | 06030423 A * | 2/1994 |
| JP | 09258741 A * | 10/1997 |
| JP | 2021113582 A * | 8/2021 |

OTHER PUBLICATIONS

Machine translation of JP-06030423-A (Year: 1994).*
Machine translation of JP-2021113582-A (Year: 2021).*
International Search Report (ISR) in international application No. PCT/CN2021/101942 mailed on Sep. 28, 2021.
CN first office action in Application No. 202110240551.5, mailed on Feb. 11, 2022.

* cited by examiner

VIBRATION ATTENUATION STRUCTURE AND EXPOSURE DEVICE

CROSS-REFERENCE TO RELATED APPLICATIONS

This application is a national stage of International Application No. PCT/CN2021/101942 filed on Jun. 24, 2021, which claims priority to Chinese Patent Application No. 202110240551.5, filed on Mar. 4, 2021. The disclosures of these applications are hereby incorporated by reference in its their entirety.

TECHNICAL FIELD

Embodiments of the present disclosure relate to the field of semiconductor manufacturing technology, in particular to a vibration attenuation structure and an exposure device.

BACKGROUND

In the manufacturing process of semiconductor devices, lithography is a crucial step. During operation of an exposure machine of a lithography device, power consumption structures of the exposure machine, such as a motor and a circuit board will generate a lot of heat, which will affect the overlay accuracy of the product. In order to reduce this impact, at present, cooling water is mainly used for cooling the power consumption structures to reduce the heat generated by the power consumption structures.

Ultrapure water (UPW) used in the water-cooling process is provided by the attachment machine such as a Lens Cooling Water Cabinet (LCWC) or Motor Cooling Water Cabinet (MCWC). The ultrapure water in the machine is delivered to various water-cooling units in the exposure machine through high pressure provided by a water pump in the LCWC or MCWC, and the power consumption structures are cooled by the water-cooling units. However, when ultrapure water is delivered through a pipe, the cooling water pipe will vibrate due to factors such as the high-speed operation of the water pump and the layout of the pipe.

The water-cooling units are distributed in many power consumption structures in the exposure machine, and among them, a mask-associated structure and a wafer-associated structure have directly impact on the wafer product. The impact of these two structures on product quality is dynamic and random, and cannot be avoided or eliminated. Once wafer products have suffered by the above impacts, they can only be reprocessed, which will cause great losses to product quality, yield, and operating costs.

Therefore, how to reduce vibration of the pipe and avoid the impact of the vibration of the pipe on product quality, thereby improving product yield, is a technical problem that needs to be solved urgently.

SUMMARY

Embodiments of the present disclosure provide a vibration attenuation structure and an exposure device for solving the problem that pipes are prone to vibration in the process of transmitting cooling water, so as to reduce the impact of the vibration of the pipe on product quality and improve product yield.

According to some embodiments, an aspect of the present disclosure provides a vibration attenuation structure, including:

a detection component covering an outer surface of a pipe and configured to detect a vibration frequency of the pipe, wherein the pipe is configured to transmit fluid; and an attenuation component covering an outer surface of the pipe, wherein the detection component and the attenuation component are arranged in parallel along a direction parallel to an axis of the pipe, and the attenuation component is capable of adjusting a vibration-absorbing frequency of the attenuation component according to the vibration frequency to attenuate vibration of the pipe.

According to some embodiments, another aspect of the present disclosure further provides an exposure device, including:

a pipe configured to transmit cooling water; and a vibration attenuation structure according to any one of the above, wherein the vibration attenuation structure is arranged on an outer surface of the pipe.

The vibration attenuation structure and exposure device provided by embodiments of the present disclosure include a detection component and an attenuation component. The frequency of the vibration generated in the fluid transmitting process of the pipe is detected in real time through the detection component. The attenuation component can adjust its own vibration-absorbing frequency in real time according to the vibration frequency detected by the detection component, such that the attenuation component realizes frequency-adjustable attenuation, thereby achieving the greatest attenuation of the vibration of the pipe, and improving the impact of the vibration of the pipe on the product quality and product yield, especially the impact on the overlay accuracy in the exposure process.

DETAILED DESCRIPTION

The specific implementations of the vibration attenuation structure and exposure device provided by embodiments of the present disclosure will be described in detail below in conjunction with the accompanying drawings.

Figure 1:
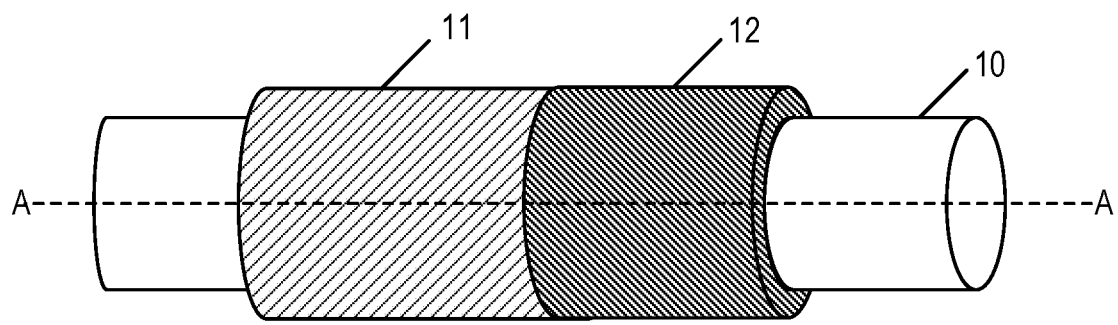
FIG. 1 is a schematic diagram of a vibration attenuation structure according to a specific implementation of an embodiment of the present disclosure.

The present implementation provides a vibration attenuation structure. FIG. 1 is a schematic diagram of a vibration attenuation structure according to the specific implementation of an embodiment of the present disclosure. As shown in FIG. 1, the vibration attenuation structure provided in the present implementation includes a detection component 11 and an attenuation component 12.

The detection component 11 covers an outer surface of a pipe 10 and configured to detect a vibration frequency of the pipe 10, where the pipe 10 is configured to transmit fluid.

The attenuation component 12 covers the outer surface of the pipe 10. The detection component 11 and the attenuation component 12 are arranged in parallel along a direction parallel to an axis of the pipe 10, and the attenuation component 12 can adjust a vibration-absorbing frequency of the attenuation component according to the vibration frequency to attenuate vibration of the pipe 10.

Specifically, during the process of transmitting fluid such as cooling water by the pipe 10, the pipe 10 may vibrate to a certain extent due to factors such as operation of the pump and layout of the pipe. The detection component 11 coats the outer surface of the pipe 10, and is configured to detect the vibration frequency of the pipe in real time during the process of transmitting fluid by the pipe 10. The attenuation component 12 coats the outer surface of the pipe 10, and is arranged in parallel with the detection component 11 in a direction parallel to the axis of the pipe 10. The attenuation component 12 is configured to attenuate vibration of the pipe 10. The detection component and the attenuation component 12 coat the outer surface of the same pipe 10, and the attenuation component 12 can adaptively adjust its own vibration-absorbing frequency according to the vibration frequency of the pipe 10 detected by the detection component 11 (that is, a frequency-adjustable vibration attenuation component is formed), such that the greatest attenuation of the real-time vibration of the pipe 10 is achieved. In this specific implementation, the vibration-absorbing frequency of the attenuation component 12 refers to a range of the vibration frequency that the attenuation component 12 can absorb.

Figure 2:
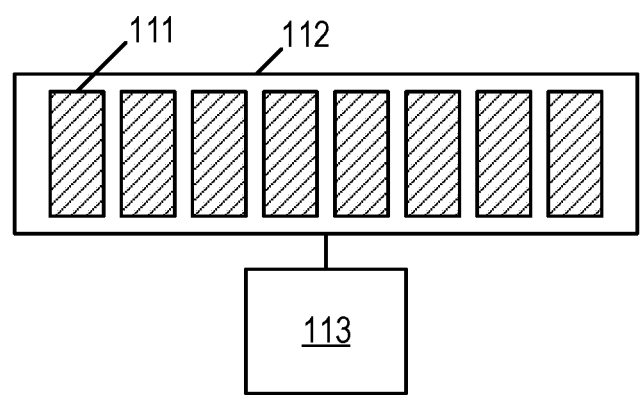
FIG. 2 is a schematic structure diagram of a detection component according to a specific implementation of an embodiment of the present disclosure.

FIG. 2 is a schematic structure diagram of a detection component according to a specific implementation of an embodiment of the present disclosure. Those skilled in the art can select the specific structure of the detection component 11 according to actual needs, as long as the vibration frequency of the pipe 10 when transmitting the fluid can be detected. In order to improve the accuracy of detecting the vibration frequency of the pipe, in some embodiments, the detection component 11 includes a detector and a processor 113.

The detector includes first piezoelectric ceramic sheets 111, and the first piezoelectric ceramic sheets 111 cover the outer surface of the pipe 10 and are configured to detect the vibration frequency of the pipe 10.

The processor 113 connects to the first piezoelectric ceramic sheets 111 and is configured to output a control signal to the attenuation component 12 according to the vibration frequency, where the control signal is configured to adjust the vibration-absorbing frequency of the attenuation component 12.

Figure 3:
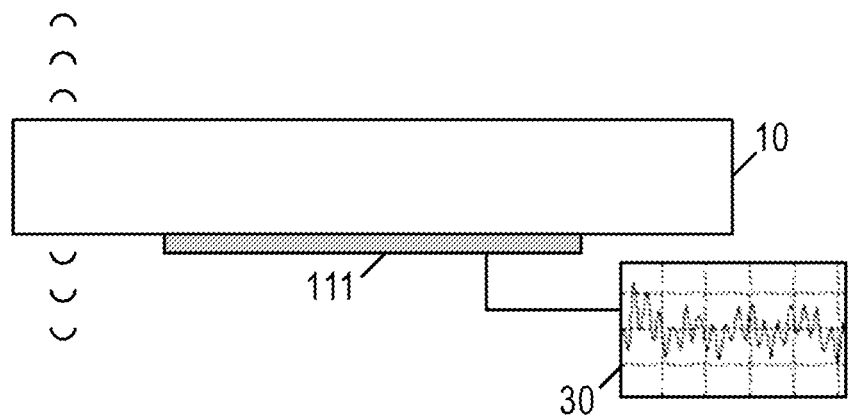
FIG. 3 is a schematic structure diagram of first piezoelectric ceramic sheets for detecting a vibration frequency of a pipe according to a specific implementation of an embodiment of the present disclosure.

FIG. 3 is a schematic structure diagram of first piezoelectric ceramic sheets for detecting a vibration frequency of a pipe according to a specific implementation of an embodiment of the present disclosure. Specifically, as shown in FIG. 2 and FIG. 3, the detector includes the first piezoelectric ceramic sheets 111. The piezoelectric ceramic sheet 111 coats the outer surface of the pipe 10. When the pipe 10 vibrates, the pipe 10 applies an external force to the first piezoelectric ceramic sheets 111, such that the first piezoelectric ceramic sheets 111 are deformed, and thus a voltage outputted by the first piezoelectric ceramic sheets 111 changes. When the vibration frequency of the pipe 10 changes, the magnitude of the external force that is applied to the first piezoelectric ceramic sheets 111 changes accordingly, and the voltage outputted by the first piezoelectric ceramic sheets 111 changes. That is, the output voltage of the first piezoelectric ceramic sheets 111 can reflect the vibration frequency of the pipe 10 during the transmission of the fluid. The waveform graph 30 in FIG. 3 represents the waveform of the voltage outputted by the first piezoelectric ceramic sheets 111 in a preset time period. The first piezoelectric ceramic sheets 111 have the advantages of high sensitivity and fast response, and can significantly improve the detection accuracy of the detector. The processor 113 is configured to receive the voltage signal transmitted by the first piezoelectric ceramic sheets 111, and convert the voltage signal into the vibration frequency of the pipe 10, for example, obtain the vibration frequency of the pipe 10 according to the change of the magnitude of the voltage outputted by the first piezoelectric ceramic sheets 111 in the preset time period.

Figure 4:
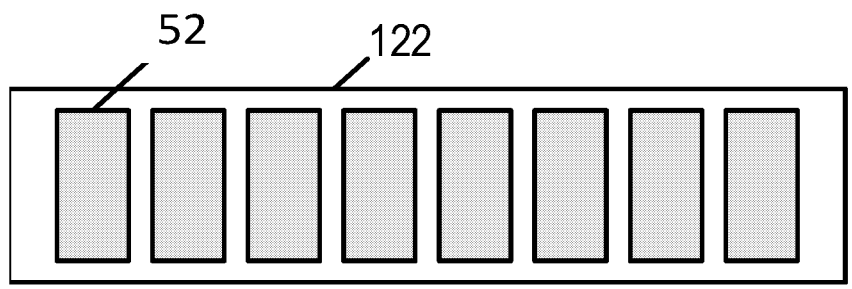
FIG. 4 is a schematic structure diagram of an attenuation component according to a specific implementation of an embodiment of the present disclosure.
Figure 5:
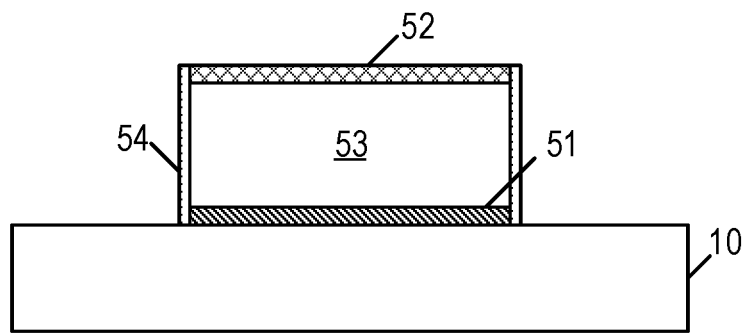
FIG. 5 is a schematic structure diagram of an attenuator when attenuating vibration of a pipe according to a specific implementation of an embodiment of the present disclosure.

FIG. 4 is a schematic structure diagram of an attenuation component according to a specific implementation of an embodiment of the present disclosure. FIG. 5 is a schematic structure diagram of an attenuator when attenuating vibration of a pipe according to a specific implementation of an embodiment of the present disclosure. In some embodiments, the attenuation component 12 includes an attenuator.

The attenuator includes an elastic film 51, second piezoelectric ceramic sheets 52, and an enclosed cavity 53 between the elastic film 51 and the second piezoelectric ceramic sheets 52. The elastic film 51 is configured to cover the outer surface of the pipe 10, and the control signal is configured to adjust deformation of the second piezoelectric ceramic sheets 52 for adjusting a resonance coefficient of the enclosed cavity 53.

In some embodiments, the attenuation component 12 further includes two braces 54.

The two braces 54 are respectively configured to connect to two ends of the elastic film 51 and two ends of the second piezoelectric ceramic sheets 52. The two braces 54, the elastic film 51, and the second piezoelectric ceramic sheets 52 collectively form and surround the enclosed cavity 53.

Material of the two braces 54 is rigid material.

In some embodiments, the attenuation component 12 further includes a driving circuit.

An input terminal of the driving circuit connects to the processor 113, an output terminal of the driving circuit connects to the second piezoelectric ceramic sheets 52, and the driving circuit is configured to adjust the deformation of the second piezoelectric ceramic sheets 52 according to the control signal for adjusting a resonance coefficient of the enclosed cavity 53.

Specifically, as shown in FIG. 4 and FIG. 5, the elastic film 51 coats the outer surface of the pipe 10, and in a direction perpendicular to the axis of the pipe 10, the second piezoelectric ceramic sheets 52 are located above the elastic film 51. There is a gap between the second piezoelectric ceramic sheets 52 and the elastic film 51, and the gap forms the enclosed cavity 53. The elastic film 51 and the second piezoelectric ceramic sheets 52 are connected by the braces 54. The processor 113 in the detection component 11 may connect to the second piezoelectric ceramic sheets 52 through the driving circuit. The processor 113 outputs the control signal to the driving circuit, and the driving circuit controls the second piezoelectric ceramic sheets 52 to deform according to the control signal. The deformation of the second piezoelectric ceramic sheets 52 will cause the volume of the enclosed cavity 53 to change accordingly, thereby changing the resonance coefficient of the enclosed cavity 53, and thus adaptive adjustment of the vibration-absorbing frequency of the attenuator is realized, so that the attenuator can absorb a variety of different vibration frequencies of the pipe. For example, when the vibration frequency of the pipe 10 increases, the output voltage of the first piezoelectric ceramic sheets 111 increases. The processor 113 outputs the control signal to the second piezoelectric ceramic sheets 52 according to the output voltage of the first piezoelectric ceramic sheets 111, and the control signal controls the deformation of the second piezoelectric ceramic sheets 52 to increase, thereby increasing the volume of the enclosed cavity 53. Accordingly, the resonance coefficient of the enclosed cavity 53 increases to adapt to the increased vibration frequency. "The pipe 10—the elastic film 51—the enclosed cavity 53" forms a "mass-spring-damping" vibration-absorbing system. By adjusting the resonance coefficient of the enclosed cavity 53, the optimal vibration frequency that can be absorbed by the attenuation component is adaptively changed, and thus the greatest attenuation of the vibration of the pipe 10 is realized.

In some embodiments, the number of the detector is multiple, and the multiple detectors are distributed around periphery of the pipe 10.

The number of the attenuator is multiple, and the multiple attenuators are distributed around periphery of the pipe 10 and in one-to-one correspondence with the multiple detectors.

In some embodiments, the detection component 11 further includes a first substrate 112.

The first substrate 112 is a circular ring-shaped structure, and the multiple detectors are all arranged on an inner surface of the first substrate 112 contacting with the pipe 10.

In some embodiments, the attenuation component 12 further includes a second substrate 122.

The second substrate 122 is a circular ring-shaped structure, and the multiple attenuators are all arranged on an inner surface of the second substrate 122 contacting with the pipe 10.

In some embodiments, the multiple detectors are symmetrically distributed with respect to the axis of the pipe 10.

In some embodiments, in a direction parallel to the axis of the pipe 10, the attenuation component 12 contacts with and connects to an end of the detection component 11.

FIG. 2 is a view of the first substrate 112 in an unfolded state, and FIG. 4 is a view of the second substrate 122 in an unfolded state. Specifically, the detection component 11 further includes the first substrate 112, and the multiple detectors are all arranged on the surface of the first substrate 112. The detection component 11 is sleeved on the periphery of the pipe 10, such that the multiple detectors are distributed around the periphery of the pipe 10, and the multiple detectors are symmetrically distributed with respect to the axis of the pipe 10, and therefore, the multiple detectors can respectively detect the vibration frequencies of the pipe 10 in multiple directions. The attenuation component 12 further includes the second substrate 122, and the multiple attenuators are all arranged on the surface of the second substrate 122. The attenuation component 12 is sleeved on the periphery of the pipe 10, such that the multiple attenuators are distributed around the periphery of the pipe 10, and the multiple attenuators are symmetrically distributed with respect to the axis of the pipe 10. In a direction parallel to the axis of the pipe 10, the attenuation component 12 contacts with and connects to the end of the detection component 11. The multiple attenuators are in one-to-one correspondence with the multiple detectors, that is, in the axial direction of the pipe 10, each of the multiple attenuators is arranged in parallel with a corresponding one of the multiple detectors, such that each of the multiple attenuators can attenuate the vibration of the pipe 10 in the corresponding direction detected by the corresponding detector. The specific number of the detectors and the specific number of the attenuators can be determined by those skilled in the art according to actual needs, for example, the specific number may be but not limited to 8.

The processor 113 may be disposed on the first substrate 112, or may be disposed outside the first substrate 112, as long as the communication connection, between the processor 113 and the first piezoelectric ceramic sheets 111, the second piezoelectric ceramic sheets 52, can be implemented.

Those skilled in the art can adjust the relative sizes of the first substrate 112 and the second substrate 122 according to actual needs. In order to simplify the manufacturing steps, in some embodiments, an inner diameter of the first substrate 112 being a circular ring-shaped structure is equal to an inner diameter of the second substrate 122 being a circular ring-shaped structure.

Figure 6:
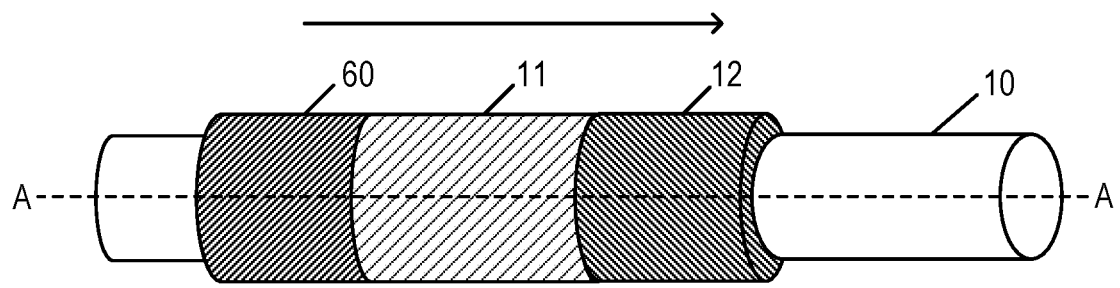
FIG. 6 is a schematic diagram of a vibration attenuation structure having an auxiliary attenuation component according to a specific implementation of an embodiment of the present disclosure.

FIG. 6 is a schematic diagram of a vibration attenuation structure having an auxiliary attenuation component according to a specific implementation of an embodiment of the present disclosure. In some embodiments, the vibration attenuation structure further includes an auxiliary attenuation component 60.

The auxiliary attenuation component 60 covers the outer surface of the pipe 10, and a vibration-absorbing frequency of the auxiliary attenuation component 60 is fixed.

In a flow direction of the fluid in the pipe 10, the auxiliary attenuation component 60 is located upstream of the attenuation component 12.

Specifically, a direction of an arrow in FIG. 6 indicates the flow direction of the fluid inside the pipe 10. The vibration of the pipe 10 occurs more in a certain frequency range, for example, at an intermediate frequency or a low frequency. By providing the auxiliary attenuation component 60 with a fixed vibration-absorbing frequency and locating the auxiliary attenuation component 60 upstream of the attenuation component 12, the vibration in a certain fixed frequency range can be absorbed before the detection of the detection component 11, such that the working load of the detection component 11 and the attenuation component is effectively reduced, and the efficiency of vibration attenuation of the pipe 10 is improved.

Figure 7:
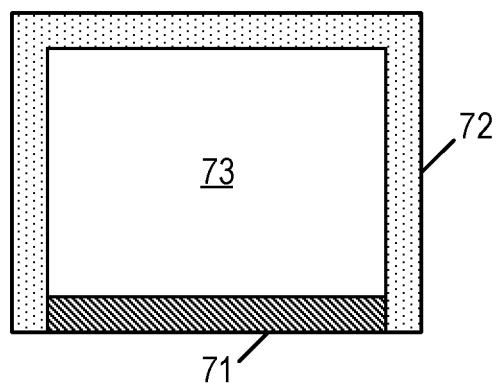
FIG. 7 is a schematic structure diagram of an auxiliary attenuator according to a specific implementation of an embodiment of the present disclosure.

FIG. 7 is a schematic structure diagram of an auxiliary attenuator according to a specific implementation of an embodiment of the present disclosure. In some embodiments, the auxiliary attenuation component 60 includes an auxiliary attenuator.

The auxiliary attenuator includes an auxiliary enclosed cavity 73 and an auxiliary elastic film 71 for sealing the auxiliary enclosed cavity 73. The auxiliary elastic film 71 is configured to coat the outer surface of the pipe 10, and the resonance coefficient of the enclosed cavity 73 is fixed.

Specifically, the auxiliary attenuation component 60 is sleeved on the periphery of the pipe 10, and the auxiliary elastic film 71 in the auxiliary attenuator coats the outer surface of the pipe 10. The opening of the auxiliary enclosed cavity 73 toward the pipe 10 is sealed by the auxiliary elastic film 71, and a cavity wall 72 of the auxiliary enclosed cavity 73 is a rigid cavity wall, so that the volume of the auxiliary enclosed cavity 73 is fixed.

In order to attenuate the specific frequency vibration of the pipe 10 in multiple directions, in some embodiments, the number of the auxiliary attenuators is multiple, and the multiple auxiliary attenuators are distributed around the periphery of the pipe 10.

Those skilled in the art can also arrange multiple auxiliary attenuation components with different vibration-absorbing frequencies according to actual needs, so as to absorb and attenuate multiple fixed frequency vibrations before the detection component 11 performs detection.

In addition, the present specific implementation further provides an exposure device. For the schematic diagram of the vibration attenuation structure in the exposure device, reference can be made to FIG. 1 to FIG. 7. As shown in FIG. 1 to FIG. 7, the exposure device provided by present specific implementation includes: a pipe 10 and the vibration attenuation structure according to any one of the above.

The pipe 10 is configured to transmit cooling water.

The vibration attenuation structure is arranged on the outer surface of the pipe 10.

In order to further improve the vibration attenuation effect, in some embodiments, the number of the vibration attenuation structure is multiple, and the multiple vibration attenuation structures are arranged at equal intervals along the axial direction of the pipe.

The vibration attenuation structure and exposure device provided by the present specific implementation include a detection component and an attenuation component. The frequency of the vibration generated in in the fluid transmitting process of the pipe is detected in real time through the detection component. The attenuation component can adjust its own vibration-absorbing frequency in real time according to the vibration frequency detected by the detection component, such that the attenuation component realizes frequency-adjustable attenuation, thereby achieving the greatest attenuation of the vibration of the pipe, and improving the impact of the vibration of the pipe on the product quality and product yield, especially the impact on the overlay accuracy in the exposure process.

The above descriptions are just part of embodiments of the present disclosure. It should be noted that for those of ordinary skill in the art, various improvements and modifications can be made within the scope of the principles of the present disclosure, and these improvements and modifications shall be within the protection range of the present disclosure.

What is claimed is:

1. A vibration attenuation structure, comprising:
a detection component covering an outer surface of a pipe and configured to detect a vibration frequency of the pipe, wherein the pipe is configured to transmit fluid; and
an attenuation component covering an outer surface of the pipe, wherein the detection component and the attenuation component are arranged in parallel along a direction parallel to an axis of the pipe, and the attenuation component is capable of adjusting a vibration-absorbing frequency of the attenuation component according to the vibration frequency to attenuate vibration of the pipe;
wherein the detection component comprises:
a detector comprising first piezoelectric ceramic sheets, wherein the first piezoelectric ceramic sheets cover the outer surface of the pipe and configured to detect the vibration frequency of the pipe; and
a processor connected to the first piezoelectric ceramic sheets and configured to output a control signal to the attenuation component according to the vibration frequency, wherein the control signal is configured to adjust the vibration-absorbing frequency of the attenuation component;
wherein the attenuation component comprises:
an attenuator comprising an elastic film, second piezoelectric ceramic sheets, and an enclosed cavity between the elastic film and the second piezoelectric ceramic sheets, wherein the elastic film is configured to cover the outer surface of the pipe, and the control signal is configured to adjust deformation of the second piezoelectric ceramic sheets for adjusting a resonance coefficient of the enclosed cavity.

2. The vibration attenuation structure according to claim 1, wherein the attenuation component further comprises two braces, the two braces are configured to connect to two ends of the elastic film and two ends of the second piezoelectric ceramic sheets respectively, the two braces, the elastic film, and the second piezoelectric ceramic sheets collectively form the enclosed cavity, and material of the two braces is rigid material.

3. The vibration attenuation structure according to claim 1, wherein the attenuation component further comprises a driving circuit, an input terminal of the driving circuit connects to the processor, an output terminal of the driving circuit connects to the second piezoelectric ceramic sheets, and the driving circuit is configured to adjust the deformation of the second piezoelectric ceramic sheets according to the control signal for adjusting a resonance coefficient of the enclosed cavity.

4. The vibration attenuation structure according to claim 3, wherein a plurality of detectors are symmetrically distributed with respect to the axis of the pipe.

5. The vibration attenuation structure according to claim 4, wherein the number of the detector is 8.

6. The vibration attenuation structure according to claim 1, wherein the detection component comprises a plurality of detectors, and the plurality of detectors are distributed around periphery of the pipe,
the attenuation component comprises a plurality of attenuators, and the plurality of attenuators are distributed around periphery of the pipe and in one-to-one correspondence with the plurality of detectors.

7. The vibration attenuation structure according to claim 1, wherein the detection component further comprises a first substrate, the first substrate is a circular ring-shaped structure, and a plurality of detectors are all arranged on an inner surface of the first substrate contacting with the pipe.

8. The vibration attenuation structure according to claim 7, wherein the processor is arranged on the first substrate, or the processor is arranged outside the first substrate.

9. The vibration attenuation structure according to claim 8, wherein the attenuation component further comprises a second substrate, the second substrate is a circular ring-shaped structure, and a plurality of attenuators are all arranged on an inner surface of the second substrate contacting with the pipe.

10. The vibration attenuation structure according to claim 9, wherein an inner diameter of the first substrate being a circular ring-shaped structure is equal to an inner diameter of the second substrate being a circular ring-shaped structure.

11. The vibration attenuation structure according to claim 1, wherein in a direction parallel to an axis of the pipe, the attenuation component contacts with and connects to an end of the detection component.

12. An exposure device, comprising:
   a pipe configured to transmit cooling water; and
   a vibration attenuation structure according to claim 1, wherein the vibration attenuation structure is arranged on an outer surface of the pipe.

13. The exposure device according to claim 12, wherein the exposure device comprises a plurality of vibration attenuation structure, and the plurality of vibration attenuation structure are arranged at equal intervals along an axial direction of the pipe.

* * * * *